United States Patent
Baleras et al.

(10) Patent No.: US 6,531,232 B1
(45) Date of Patent: Mar. 11, 2003

(54) SYSTEM FOR ASSEMBLING SUBSTRATES TO BONDING ZONES PROVIDED WITH CAVITIES

(75) Inventors: François Baleras, Seyssinet (FR); Pierre Renard, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/807,688
(22) PCT Filed: Oct. 28, 1999
(86) PCT No.: PCT/FR99/02626
§ 371 (c)(1), (2), (4) Date: Apr. 16, 2001
(87) PCT Pub. No.: WO00/26958
PCT Pub. Date: May 11, 2000

(30) Foreign Application Priority Data
Oct. 29, 1998 (FR) .............................................. 98 13583

(51) Int. Cl.⁷ ......................... H01L 21/50; H01L 29/02; B23K 31/00; B32B 3/10
(52) U.S. Cl. ....................... 428/594; 428/601; 428/620; 228/165; 228/179.1
(58) Field of Search ................................. 428/596, 594, 428/601, 620; 228/165, 179.1

(56) References Cited

U.S. PATENT DOCUMENTS

| | | | | |
|---|---|---|---|---|
| 5,561,085 A | * | 10/1996 | Gorowitz et al. | |
| 5,591,941 A | * | 1/1997 | Acocella et al. | 144/134.1 |
| 5,643,831 A | * | 7/1997 | Ochiai et al. | |
| 6,084,781 A | * | 7/2000 | Klein | |
| 6,105,852 A | * | 8/2000 | Cordes et al. | |
| 6,149,048 A | * | 11/2000 | Brearley et al. | |

FOREIGN PATENT DOCUMENTS

| | | |
|---|---|---|
| DE | 33 28 975 | 3/1984 |
| EP | 0 616 238 | 9/1994 |
| EP | 0 809 289 | 11/1997 |

OTHER PUBLICATIONS

Patent Abstracts of Japan: Ceramic Package Semiconductor Device. Publ. No. 59017271, Publ. Date Jan. 1984.

* cited by examiner

Primary Examiner—John J. Zimmerman
Assistant Examiner—Jason Savage
(74) Attorney, Agent, or Firm—Pearne & Gordon LLP

(57) ABSTRACT

The invention relates to a system comprising a first substrate (100) with at least one bonding area (110a, 110b), liable to be assembled with a second substrate (200), the bonding area (110a, 110b) comprising an area made of a material (104) that can be wetted with a meltable material. According to the invention, the bonding area (110a, 110b) comprises at least one cavity (120) to receive meltable material.

11 Claims, 3 Drawing Sheets

SYSTEM FOR ASSEMBLING SUBSTRATES TO BONDING ZONES PROVIDED WITH CAVITIES

FIELD OF THE INVENTION

The present invention relates to a substrate assembly system, using a meltable material.

Substrates may be assembled by means of meltable material by placing the substrates to be assembled into contact, heating a meltable material previously positioned in mutual bonding areas of the substrates and leaving said material to cool to solder the bonding areas together.

The invention may be applied to the production of electronic devices, particularly ultrahigh frequency circuits.

In ultrahigh frequency circuits, the invention may be implemented to attach a cover to the components. Such a cover is particularly intended to favour signal propagation and form a shield against parasitic electromagnetic radiation.

More generally, the invention may also be applied to the production of devices including microelectronic and/or micromechanical components requiring a shielding or protective part.

For example, the invention may be used in the production of accelerometers including an electronic measurement circuit and a seismic feeder, i.e. a micromechanical component liable to move under the effect of acceleration. In this example, a protective cover may be used particularly to prevent excessive movement of the feeder.

STATE OF THE PRIOR ART

The most frequently used technique for assembling two substrates is the "flip chip" technique. This technique essentially comprises the following steps:

deposition of assembly beads or wafers made of a meltable material on bonding areas of the substrates to be assembled, assembly of the substrates such that the pairs of bonding areas of each of the substrates respectively are placed opposite each other, at least one of the bonding areas of each pair being equipped with meltable material, heating of substrates to bring the two parts to be assembled, placed opposite each other, to a temperature slightly above the melting point of the bead material, so as to carry out soldering, joining the bonding areas located respectively on each of the substrates together.

The role of the interconnection beads made of meltable material is essentially to ensure the cohesion of the structure formed by the assembled substrates. Another of the beads' roles, particularly for assemblies including electronic circuits, is to supply a path for electrical contact between the assembled parts.

Finally, the beads may be used beneficially to adjust and maintain a determined spacing between the assembled substrates, in particular between a substrate comprising a component and a substrate forming a cover.

The last function may be essential, particularly in the formation of accelerometers wherein the cover is used to adjust the travel or the maximum movement of a seismic feeder. The seismic feeder is in fact a fragile mechanical device and the cover is used to prevent excessive movement or deformation of the feeder liable to cause its rupture.

Although the assembly technique using beads made of meltable material is practical to use, its precision remains insufficient for adjusting a spacing between substrates which is less than or equal to 15 $\mu$m.

To ensure precise and uniform spacing less than 15 $\mu$m, it is essential to use special production and testing techniques relating to the level of the meltable material beads.

In particular, the meltable material of the beads or wafers may be formed electrolytically by dispensing or any other deposition technique. It is particularly formed into bonding areas comprising areas of material that can be wetted with the meltable material, also referred to as "interconnection blocks".

Special techniques to produce meltable material beads increase the number of steps in the process, particularly to prepare deposition or growth masks, and induce a higher assembly cost.

The state of the art is also illustrated in the following documents relating to component assembly:

D1: EP-A-0 558 325 (HUGHES AIRCRAFT COPANY) Feb. $25^{th}$ 1993 (Feb. 25, 1993)

D2: DE 33 28 975-A-(ISRONICS INC Mar. $1^{st}$ 1984 (Mar. 1, 1984)

D3: EP-A-0 616 238 (TEXAS INSTRUMENTS INC) Sep. $21^{st}$ 1994 (Sep. 21, 1994)

D4: EP-A-0 809 289 (HARRIS CORP) Nov. $26^{th}$ 1997 (Nov. 26, 1997)

D5: PATENT ABSTRACTS OF JAPAN, vol. 008, no. 099 (E-243) May $10^{th}$ 1984 (May 10, 1984) & JP 59 01727-A-(NIPPON DENKI KK), Jan. $28^{th}$ 1984 (Jan. 28, 1984).

DESCRIPTION OF THE INVENTION

The aim of the present invention is to propose a substrate and, more generally, a substrate assembly system without the limitations described above.

One of its specific aims is to propose a substrate and an assembly system not requiring additional processing operations.

Another aim is to propose an assembly system that is inexpensive to produce and implement.

A further aim is to propose an assembly system and method making it possible to adjust, simply and with great precision, the spacing between substrates, particularly spacing less than 15 $\mu$m.

To achieve these aims, the invention more specifically relates to a system comprising a first substrate with at least one bonding area, liable to be assembled with a second substrate, the bonding area comprising an area made of a material that can be wetted with a meltable material. In addition, according to the invention, the bonding area comprises at least one cavity to receive meltable material.

According to the present invention, the term substrate refers to any part liable to be assembled with a meltable material. Therefore, a substrate may be, for example, a cover, a surface comprising mechanical, optical and/or electronic components, individually or in a circuit. The "substrate" may also consist of a micromechanical part, intended to be assembled with other parts to form a structure.

The present description of the invention relates to a simplified case in which the system of substrates to be assembled only comprises two substrates. It is understood that the invention applies to any system comprising a number of substrates greater than or equal to two.

The substrate bonding areas, particularly the areas of wettable material, are intended to receive the meltable material.

With the invention, the quantity of meltable material required to produce an assembly with a given spacing may be determined with a lower precision. Indeed, any excess meltable material may be collected in the cavities of the bonding areas. By setting their volume, the cavities also make it possible to adjust the level of meltable material assembling the two substrates.

In addition, since the meltable material can be collected in the cavities, it is possible, with good precision, to obtain spacing levels of the order of one micrometer between the substrates.

The walls of the cavities may be made of a material that can be wetted with the meltable material. When they are made of a wettable material, the walls of the cavity also contribute to the bonding, i.e. the cohesion of the structures.

Conversely, when they are made of a non-wettable material, the cavities receive any excess meltable material which is not fixed in the cavity. The non-wettable nature of the cavity walls may also be used beneficially to delimit the extension of the surface on which the solder is produced, i.e., definitively, to delimit the extension of the bonding area.

The bonding area may be delimited particularly by one or more cavities surrounding it.

For a given quantity of meltable material, the hybridisation level, i.e. the spacing level between the assembled substrates is essentially governed by the extension of the bonding area.

In this way, when the cavities are used to delimit the bonding area, the distance provided between the cavities makes it possible to adjust the hybridisation level.

In a specific case in which the volume of meltable material placed in a bonding area is less than the overall volume of the cavities associated with said bonding area, the hybridisation level is set automatically to a minimum value of the order of one micron.

Otherwise, the level is greater, and may be adjusted to a required value. If the surface area of the bonding area is known and a required assembly height is defined, it is possible to determine the volume of meltable material required.

This gives: $V_f = H*S + V_c$

In these expression, $V_f$ corresponds to the volume of meltable material, H to the assembly level, S to the surface area of the bonding area and $V_c$ to the volume of the cavities.

Therefore, the equation giving the assembly height may be expressed as follows:

$$H = \frac{V_f - V_c}{S}$$

For example, for a bonding area of $2 \times 5$ mm$^2$ surrounded by four cavities: 2 cavities of $0.1 \times 5$ mm$^2$, 2 cavities of $0.1 \times 2$ mm$^2$, for a volume of meltable material of $20.8 \cdot 10^{-2}$ mm$^3$, the assembly height will be approximately 10 µm.

The invention also relates to an assembly system comprising a first substrate and at least a second substrate, the first and second substrates comprising bonding areas. The bonding areas of the first and second substrates are conjugated in pairs respectively such that a first bonding area of a pair is positioned opposite a second conjugated bonding area of the pair, when the first and second substrates are assembled. In addition, the bonding areas each comprise at least one area of material that can be wetted with a meltable material, and at least one of the bonding areas of a pair comprises a boss of meltable material in contact with the area of meltable material. According to the invention, at least one of the bonding areas of each pair comprises at least one cavity to receive meltable material.

The term boss refers to any agglomeration of meltable material liable to contribute to the assembly (or hybridisation) of substrates. Bosses may particularly come in the form of beads, wafers or small columns.

In a specific embodiment of the system, only the bonding areas of one of the substrates is equipped with bosses of meltable material, but free of cavities. The second substrate, comprising the conjugated bonding areas is free of meltable material (before assembly) but comprises the cavities intended to collect the excess meltable material during assembly.

The invention also relates to a method to produce a system comprising a first and a second substrate as described. According to this method:

the first and second substrates are assembled such that the bonding areas of a pair are opposite each other and separated by at least one boss of meltable material respectively, the meltable material is heated to a sufficient temperature to solder the meltable material respectively on the bonding areas opposite each other and to induce the flow of excess meltable material in at least one cavity of the bonding areas, and the meltable material is allowed to cool so that it sets.

The present invention's other characteristics and advantages will be seen more clearly upon reading the following description, with reference to the figures appended. This description is given solely as an illustration and is not restrictive.

DETAILED DESCRIPTION OF EMBODIMENTS OF THE INVENTION

Figure 1:
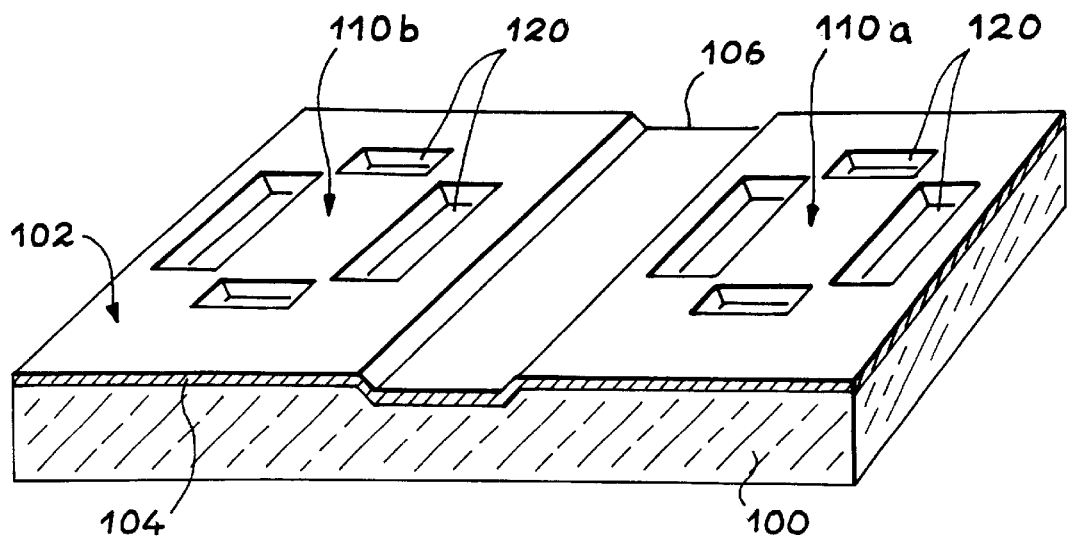
FIG. 1 represents a simplified view of the substrate according to the invention.

FIG. 1 represents a substrate 100 shaped according to the invention with a view to producing a cover for an ultrahigh frequency transmission line.

The substrate 100, made of an insulating or semiconductor material, such as silicon, comprises a side 102 coated with a metallic layer 104. The metallic layer can be wetted with a meltable material liable to be used for an assembly operation.

The side 102 of the substrate comprises a rectilinear central recess 106 intended to form a housing for a component of a second substrate (not shown) to which the substrate 100 may be attached.

The side 102 of the substrate also comprises two bonding areas 110a, 110b arranged at either side of the recess 106. The bonding areas comprise an area of wettable material, formed by the metallic layer 104, and comprise cavities 120. Each bonding area 110a, 110b, of a rectangular shape, comprises four cavities 120. The cavities are arranged respectively on each of its sides so as to delimit and surround the bonding areas.

In the example described, once the metallic layer 104 covers the entire face 102, the cavities 120 may comprise walls that can be wetted with a meltable material.

If applicable, the bonding areas may also be surrounded respectively by an area (not shown) with a non-wettable surface.

The cavities 120 may be made in the substrate either before the metallic layer 104 is applied (the cavities comprise wettable walls in this case) or after the metallic layer 104 has been engraved (the cavities comprise non-wettable walls).

Figure 2:
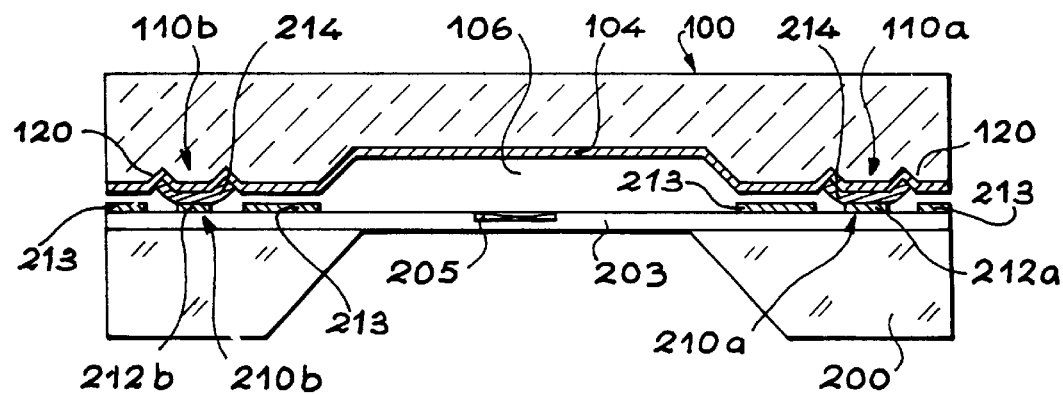
FIG. 2 is a schematic cross-section of a microwave propagation system using a substrate similar to that in FIG. 1.

FIG. 2 shows a section view of an ultrahigh frequency system using a first substrate similar to FIG. 1 as a cover.

Identical or similar components in FIGS. 1 and 2, and in the subsequent figures, are identified with the same reference for easier reading.

The ultrahigh frequency system in FIG. 2 also comprises a second substrate 200 used to support a suspended membrane 203. Said membrane is composed of insulating materials which cannot be wetted with the meltable material used for hybridisation.

An ultrahigh frequency propagation line 205 runs along the central part of the membrane, perpendicular to the plane in the figure.

Peripheral parts of the membrane, where said membrane covers the substrate, comprise the bonding areas 210a, 210b.

The bonding areas 210a, 210b each comprise an area of wettable material 212a, 212b in the form of a metallic block formed on the surface of the membrane.

The areas of wettable material surrounded by non-wettable areas, formed by stripped portions of the membrane 203.

The ultrahigh frequency system in FIG. 2 also comprises a substrate 100, similar to that in FIG. 1, which is offset onto the substrate 200 so as to coincide with the bonding areas 110a, 110b of the first substrate 100 with the bonding areas 210a, 210b of the second substrate 200 respectively.

In addition, it can be seen that the recess 106 of the substrate 100 is arranged in order to coincide with the ultrahigh frequency propagation line 205.

The metallic layer 104 of the first substrate 100 forms a ground layer intended to shield the ultrahigh frequency line.

This ground layer must be connected electrically to other ground layers of the second substrate supporting the ultrahigh frequency line.

In FIG. 2, metallic areas 213, as for the area of wettable material 212a, 212b may form ground layers of the second substrate.

In addition, it is necessary to position the ground layer at a given distance from the propagation line, determined by its ultrahigh frequency transmission characteristics and properties. This distance is 200 $\mu$m, for example.

The ground layer of the first substrate is placed in electrical contact with the second substrate by means of a meltable material 214 placed between the bonding areas opposite each other. The meltable material also ensures the spacing between the substrates and that they are secured mechanically.

Preferentially, the cavities 120 of the first substrate 100, forming the cover, comprise a volume greater than the volume of the meltable material introduced. In this way, the hybridisation level, i.e. the spacing of the substrates in the vicinity of the bonding areas is very small, of the order of one micrometer.

The spacing (200 $\mu$m) which should be allowed between the ground layer, i.e. the layer 104 of the cover, and the propagation line 205 may be adjusted very precisely by simply controlling the cover engraving depth when the recess 106 is formed.

FIGS. 3 to 7 give a more precise indication of an example of the treatment of a block of substrate according to the invention.

Figure 3:
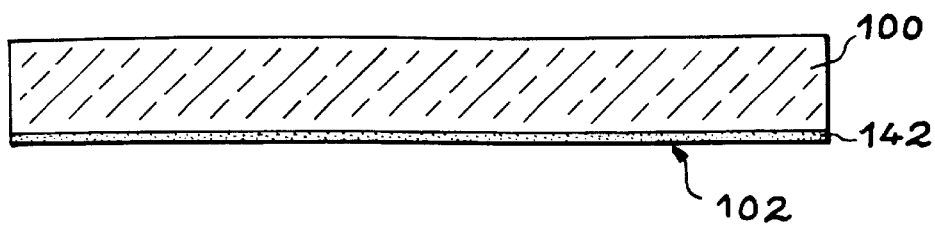
FIGS. 3 to 7 are schematic sections of substrates illustrating the successive steps for preparing a first substrate according to the invention.

In a first step, illustrated by FIG. 3, on a side 102 of a block of substrate 100, a continuous layer 142 of masking material is formed. The substrate 100 is, for example, a silicon substrate and the mask layer 142 is, for example, a layer of silicon nitride in relation to which the substrate material can be engraved selectively.

Figure 4:
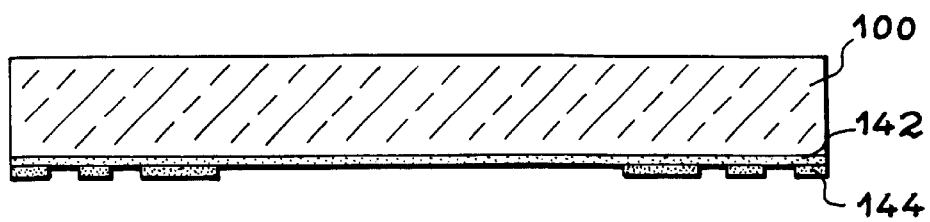

FIG. 4 shows the formation on the mask layer 142 of a layer of photosensitive resin 144 according to a predetermined pattern. The pattern is obtained using conventional insolation photolithographic techniques followed by development of the resin layer.

The mask layer 142 then undergoes selective dry or wet engraving with reference to the substrate material, so as only to leave part of said mask layer corresponding to the resin layer pattern on the substrate surface.

Figure 5:
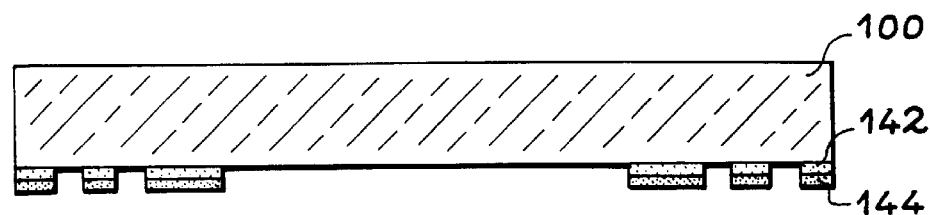

FIG. 5 shows the state of the substrate after said engraving.

After the resin layer is removed, the substrate also undergoes engraving, for example chemical engraving in a KOH solution so as to produce recesses in the substrate.

The engraving of the recesses is selective with reference to the material of the mask layer 142 which protects the parts of the substrate that it covers.

Figure 6:
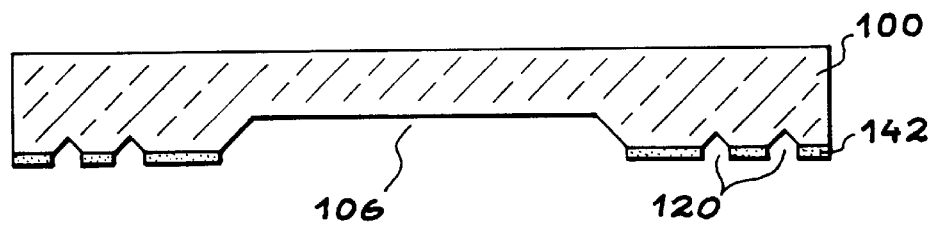

As shown in FIG. 6, in the example illustrated, after engraving, a central recess 106, which may coincide, for example, with a component of another substrate and recesses 120 in the peripheral areas, in which bonding areas are to be formed, are obtained.

Figure 7:
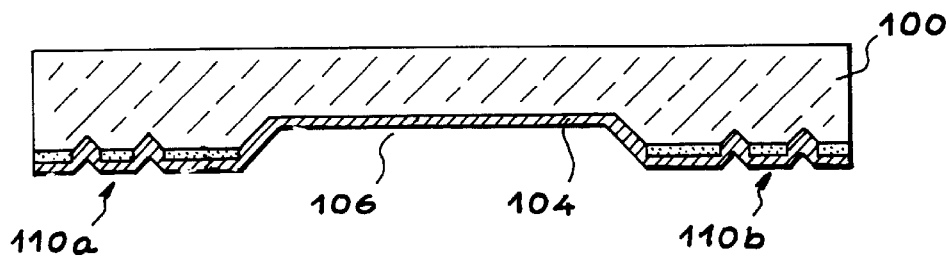

The bonding areas identified with the references 110a, 110b in FIG. 7 are essentially formed by depositing a metal layer 104 by spraying on the engraved substrate surface. The metal is for example titanium-nickel or titanium-copper, and can be wetted with a meltable material. The metal layer 104 also covers the parts of the mark layer remaining on the substrate surface. Finally, the metal layer 104 lines the walls of the recesses 120 forming the cavities to receive meltable material.

Figure 8:
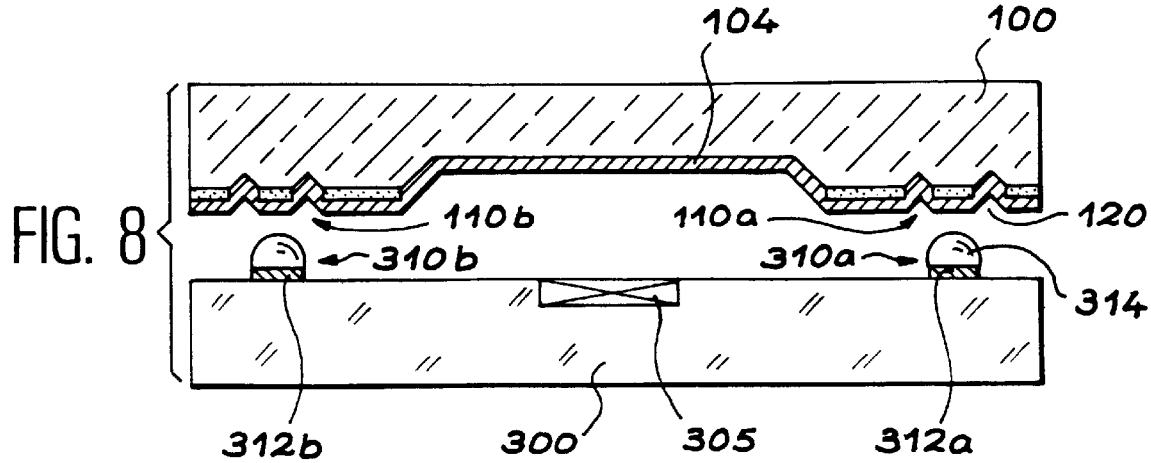
FIGS. 8 and 9 are schematic sections illustrating the assembly of the first substrate in FIG. 7 with a second substrate.

FIG. 8 shows a system of substrates to be assembled. This system comprises the substrate 100 in FIG. 7 and another substrate 300 that may comprise components 305.

The substrate 300, made of a non-wettable material, comprises bonding areas 310a, 310b wherein connection blocks 312a, 312b made of a material, such as Cu, Ti-Ni or Ti-Cu, that can be wetted with a meltable material, are formed. Also, according to the invention, the blocks 312a, 312b form the areas of wettable material of the bonding areas 310a, 310b.

The blocks are produced by engraving a metallic layer according to a pattern also defined by a resin mask (not shown).

The bonding areas 310a, 310b of the second substrate 300 are conjugated in position in the bonding areas 110a, 110b of the first substrate 100, so as to form pairs of bonding areas opposite each other.

The areas of wettable material formed by the blocks 312a, 312b are surrounded by the non-wettable material of the second substrate.

On the blocks 312a and 312b, a quantity of meltable material, for example in the form of beads of bosses 314, is deposited. The meltable material is for example an alloy based on indium, tin-lead or any other meltable material, liable to melt (or soften) at low temperatures. An example is a 60/40 SnPb alloy.

The meltable material may be deposited on the blocks 312a, 312b very simply by dispensing. This method is quicker and more economical than chemical or electrolytic material formation methods.

In addition, once the cavities 120 are provided to absorb the excess material, the quantity of material applied is not very critical.

The substrates are assembled such that the beads of meltable material are placed in contact with the bonding areas of the first substrate.

The beads of meltable material, and possibly the entire structure, are then heated to a sufficient temperature to soften or melt the meltable material, such that the material can be soldered onto the corresponding bonding areas.

Figure 9:
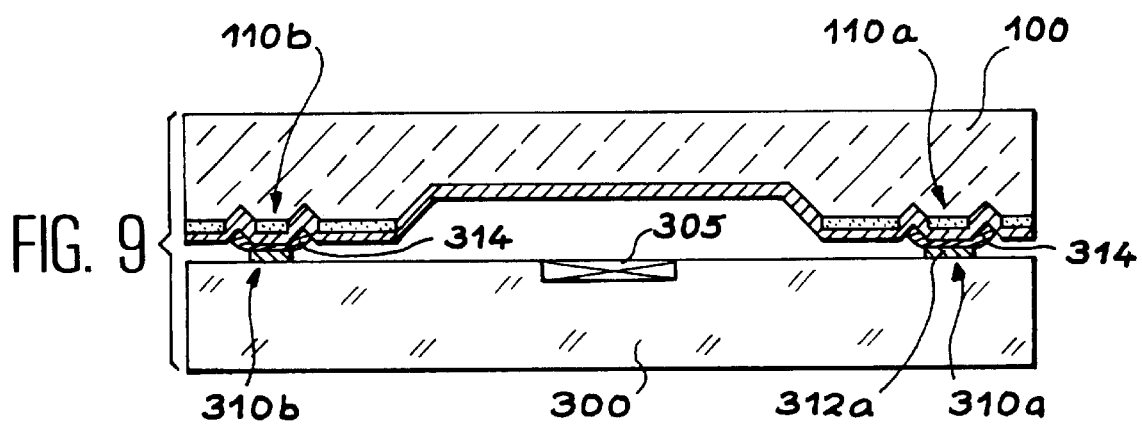

After cooling, the assembly illustrated in FIG. 9 is obtained. It can be seen that excess meltable material has flowed into the cavities 120 of the first substrate 100 and that only a small quantity of material remains between the bonding areas.

What is claimed is:

1. Substrate (100) with at least one bonding area (110 a, 110b), liable to be assembled with a second substrate (200, 300), the bonding area(110a, 110b) comprising an area made of a material (104) that can be wetted with a meltable material wherein the bonding area (110a, 110b) comprises at least one cavity (120) to receive meltable material to adjust a level of meltable material between the substrates and wherein said area made of the material that can be wetted extends outside of said cavity.

2. Substrate according to claim 1, wherein the cavity (120) comprises walls that can be wetted with a meltable material.

3. Substrate according to claim 1, wherein the cavity (120) comprises walls that cannot be wetted with a meltable material.

4. Substrate according to claim 1, wherein the cavity or cavities (120) surround the area of wettable material of the bonding area so as to delimit it.

5. Substrate according to claim 1, wherein said second substrate (200,300) comprises bonding areas (210a, 210b, 310a, 310b) and the bonding areas of the first and second substrates being conjugated in pairs respectively, such that a first bonding area (110a, 110b) of a pair is positioned opposite a second conjugated bonding area (210a, 310a, 210b, 310b) of the pair, when the first and second substrates are assembled, and wherein at least one of the bonding areas of a pair comprises a boss (214, 314) of meltable material in contact with the area of wetable material.

6. Substrate according to claim 5, wherein one of the bonding areas, comprising the boss of meltable material, is free of cavities and a second bonding area, free of meltable material, comprises at least one cavity (120).

7. Substrate according to claim 5, wherein one of the bonding areas (110a, 110b) comprises a plurality of cavities (120), arranged at its periphery to surround and delimit it.

8. Substrate according to claim 5, wherein at least one cavity (120), comprises walls made of a wetable material.

9. Substrate according to claim 5, wherein at least one of the first and second substrates also comprises a recess (106) to house components.

10. Substrate according to claim 5, wherein the bonding areas (110a, 110b, 310a, 310b) of at least one pair of bonding areas are connected by a boss (314) made of meltable material, the boss extending at least partly in a recipient cavity (120) on one of the bonding areas.

11. Substrate according to claim 10, wherein the height of the boss (314) is of the order of 1 µm.

* * * * *